(12) United States Patent
Park et al.

(10) Patent No.: US 9,166,124 B2
(45) Date of Patent: Oct. 20, 2015

(54) LIGHT EMITTING DEVICE PACKAGE AND HEADLIGHT FOR VEHICLE HAVING THE SAME

(71) Applicant: Samsung Electronics Co., Ltd., Suwon-Si, Gyeonggi-Do (KR)

(72) Inventors: Hee Seok Park, Suwon-si (KR); Ji Seok Wang, Suwon-si (KR); Kwon Jin Kim, Hwaseong-si (KR); Hee Dong Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 39 days.

(21) Appl. No.: 13/926,241

(22) Filed: Jun. 25, 2013

(65) Prior Publication Data
US 2014/0078763 A1    Mar. 20, 2014

(30) Foreign Application Priority Data

Sep. 17, 2012  (KR) .......................... 10-2012-0103041

(51) Int. Cl.
*H01L 33/50*     (2010.01)
*F21S 8/10*      (2006.01)
*H01L 25/075*    (2006.01)

(52) U.S. Cl.
CPC ........... *H01L 33/505* (2013.01); *F21S 48/1104* (2013.01); *F21S 48/115* (2013.01); *F21S 48/1159* (2013.01); *F21S 48/321* (2013.01); *F21S 48/328* (2013.01); *H01L 25/0753* (2013.01); *H01L 33/504* (2013.01); *H01L 2924/0002* (2013.01)

(58) Field of Classification Search
USPC .................. 362/84, 293, 294; 257/98, 99
See application file for complete search history.

(56) References Cited

U.S. PATENT DOCUMENTS

| 6,468,821 | B2 | 10/2002 | Maeda et al. | |
|---|---|---|---|---|
| 6,963,166 | B2 | 11/2005 | Yano et al. | |
| 7,183,577 | B2 | 2/2007 | Mueller-Mach et al. | |
| 2004/0173806 | A1* | 9/2004 | Chua | 257/98 |
| 2006/0097621 | A1 | 5/2006 | Park et al. | |
| 2010/0128463 | A1* | 5/2010 | Kim et al. | 362/84 |
| 2010/0276716 | A1* | 11/2010 | Kwon et al. | 257/98 |
| 2011/0127912 | A1* | 6/2011 | Lee et al. | 315/32 |
| 2012/0161164 | A1* | 6/2012 | Kim | 257/88 |

FOREIGN PATENT DOCUMENTS

| KR | 2006-0040321 A | 5/2006 |
|---|---|---|
| KR | 2006-0095271 A | 8/2006 |

* cited by examiner

*Primary Examiner* — Sikha Roy
(74) *Attorney, Agent, or Firm* — Harness, Dickey & Pierce, P.L.C.

(57) ABSTRACT

A light emitting device package according to example embodiments includes a plurality of light emitting device chips arranged linearly and spaced apart from each other on a substrate, and a plurality of wavelength conversion units on upper surfaces of the plurality of light emitting device chips. The plurality of wavelength conversion units may each have portions that extend over regions between the plurality of light emitting device chips. A vehicle headlight may include the light emitting device package.

20 Claims, 10 Drawing Sheets

LIGHT EMITTING DEVICE PACKAGE AND HEADLIGHT FOR VEHICLE HAVING THE SAME

CROSS-REFERENCE TO RELATED APPLICATIONS

This application claims priority under 35 U.S.C. §119 to Korean Patent Application No. 10-2012-0103041 filed on Sep. 17, 2012, in the Korean Intellectual Property Office, the entire disclosure of which is incorporated herein by reference.

BACKGROUND

1. Field

Example embodiments relate to a light emitting device package and/or a vehicle headlight using a light emitting device package as a light source thereof.

2. Description of Related Art

A light source using a socket bulb may generally be used as a light source for a headlight installed in a vehicle. A socket bulb is a lighting instrument in which a noncombustible gas is stored within a light bulb in a vacuum state and a filament such as tungsten, or the like, is heated electrothermally to obtain light to be radiated therefrom.

However, socket bulbs generally have a relatively short life span and low impact resistance. Thus, recently, a high degree of effort and interest has been concentrated on developing a light source, such as a light emitting diode (LED), that may be used with a low voltage and which may have excellent durability, a long life span, and a simple structure so as to have various shapes.

A vehicle headlight to which an LED is applied may be designed to produce a great quantity of light in terms of properties thereof, and thus, a plurality of LED chips may be continuously arranged to form a light source having a high degree of luminance.

However, when a plurality of LED chips are arrayed, a rectangular cutoff in light distribution characteristics may be generated, resulting in a failure of obtaining continuous light. This may result from a structural problem in which light is separated by a space between LED chips so as to be seen to be discontinuous.

SUMMARY

Example embodiments relate to a light emitting device package and/or a vehicle headlight using a light emitting device package as a light source thereof.

In a light emitting device and a vehicle headlight using a light emitting device package having a light emitting device as a light source, a vehicle headlight having excellent light distribution characteristics allowing light to be obtained without a rectangular cutoff may be desired.

According to example embodiments, a light emitting device package includes: a substrate; a plurality of light emitting device chips arranged linearly and spaced apart from each other on the substrate; and a plurality of wavelength conversion units on upper surfaces of the plurality of light emitting device chips, the plurality of wavelength conversion units each having portions that extend over regions between the plurality of light emitting device chips.

In example embodiments, the plurality of wavelength conversion units may contact each other.

In example embodiments, the plurality of wavelength conversion units may include phosphor films.

In example embodiments, each of the plurality of wavelength conversion units may include one or more phosphor layers.

In example embodiments, each of the plurality of wavelength conversion units may have a rectangular shape, and a longer side of the rectangular shape may extend in a direction in which the light emitting device chips are arranged.

In example embodiments, the longer side of each of the plurality of wavelength conversion units may be longer than one side of each of the plurality of light emitting device chips, and a shorter side of each of the plurality of wavelength conversion units may be similar to a length of a different side of each of the plurality of light emitting device chips.

In example embodiments, an upper surface of the substrate, sidewalls of an adjacent two of the plurality of light emitting device chips, and parts of lower surfaces of an adjacent two of the plurality of wavelength conversion units may define a cavity, and the upper surface of the substrate may include a reflective surface along an inner circumferential surface that is sloped inwardly toward the plurality of light emitting device chips.

According to example embodiments, a vehicle headlight may include: the foregoing light emitting device package; a heat dissipation unit, the light emitting device package on the heat dissipation unit, the heat dissipation unit being configured to transmit heat generated by the light emitting device package outwardly away from the light emitting device package; a reflective unit over an upper side of the light emitting device package and the heat dissipation unit, the reflective unit being configured to guide and reflect light output from the light emitting device package; and a lens cover unit configured emit light reflected through the reflective unit to the outside.

In example embodiments, the heat dissipation unit may include a heat sink on a cooling fan, the light emitting device package may be on the heat sink, the heat sink may be configured to transmit heat generated by the light emitting device package outwardly and away from the light emitting device package, and the cooling fan may be configured to increase a heat emission efficiency of the heat sink.

In example embodiments, the plurality of wavelength conversion units may contact each other.

In example embodiments, the plurality wavelength conversion units may include phosphor films.

In example embodiments, each of the plurality of wavelength conversion units may include one or more phosphor layers.

In example embodiments, each of the plurality of wavelength conversion units may have a rectangular shape, and a longer side of the rectangular shape may extend in a direction in which the light emitting device chips are arranged.

In example embodiments, the longer side of each of the plurality of wavelength conversion units may be longer than one side of each of the plurality of light emitting device chips, and a shorter side of each of the plurality of wavelength conversion units may be similar to a length of a different side of each of the plurality of light emitting device chips.

In example embodiments, an upper surface of the substrate, sidewalls of an adjacent two of the plurality of light emitting device chips, and part of lower surfaces of an adjacent two of the plurality of wavelength conversion units may define a cavity, the upper surface of the substrate may include a reflective surface along an inner circumferential surface that is sloped inwardly toward the plurality of light emitting device chips.

According to example embodiments, a light emitting device package includes: a substrate; plurality of light emitting device chips spaced apart from each other in a first direction on the substrate; and a plurality of wavelength conversion units on the plurality of light emitting device chips. The plurality of wavelength conversion units each extend parallel to the upper surface of the substrate. At least one of the plurality of wavelength conversion units is wider in the first direction than a width in the first direction of a corresponding one of the plurality of light emitting device chips.

In example embodiments, each one of the plurality of wavelength conversion units may include a plurality of phosphor layers stacked on each other, one of the plurality of phosphor layers may be configured to emit a short wavelength of light than a different one of the plurality of phosphor layers, and the different one of the plurality of phosphor layers may be on the one of the plurality of phosphor layers.

In example embodiments, the plurality of wavelength conversion units may each include: a first phosphor film configured to convert light from the plurality of light emitting device chips into a first wavelength of light; a second phosphor film on the first phosphor film, the second phosphor film being configured to convert light from the plurality of light emitting device chips into a second wavelength of light; and a third phosphor film on the second phosphor film, the third phosphor film being configured to convert light from the plurality of light emitting device chips into a third wavelength of light. The third wavelength of light may be longer than the second wavelength of light. The second wavelength of light may be longer than the first wavelength of light. The first to third wavelengths of light may combine to form white light.

In example embodiments, the upper surface of the substrate may include a middle portion and a sloped portion, the plurality of light emitting device chips may be on the middle portion of the substrate, and the sloped portion may be an inner circumferential surface that is sloped inwardly toward the plurality of light emitting device chips.

According to example embodiments, a vehicle headlight may include: the foregoing light emitting device package; a heat dissipation unit, the light emitting device package on the heat dissipation unit, the heat dissipation unit being configured to transmit heat generated by the light emitting device package outwardly away from the light emitting device package; a reflective unit over an upper side of the light emitting device package and the heat dissipation unit, the reflective unit being configured to guide and reflect light output from the light emitting device package; and a lens cover unit configured emit light reflected through the reflective unit to the outside.

BRIEF DESCRIPTION OF THE DRAWINGS

The above and other aspects, features and other advantages of example embodiments will be more clearly understood from the following detailed description of non-limiting embodiments, as illustrated in the accompanying drawings. The drawings are not necessarily to scale, emphasis instead being placed upon the principles of example embodiments. In the drawings.

DETAILED DESCRIPTION

Figure 1:
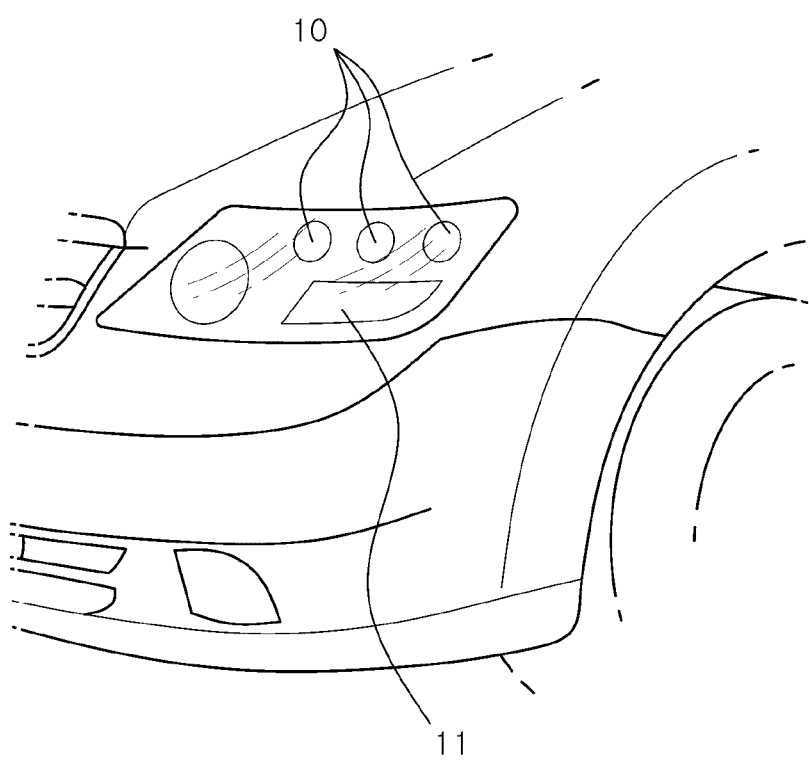
FIG. 1 is a schematic view illustrating a configuration of a vehicle headlight according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
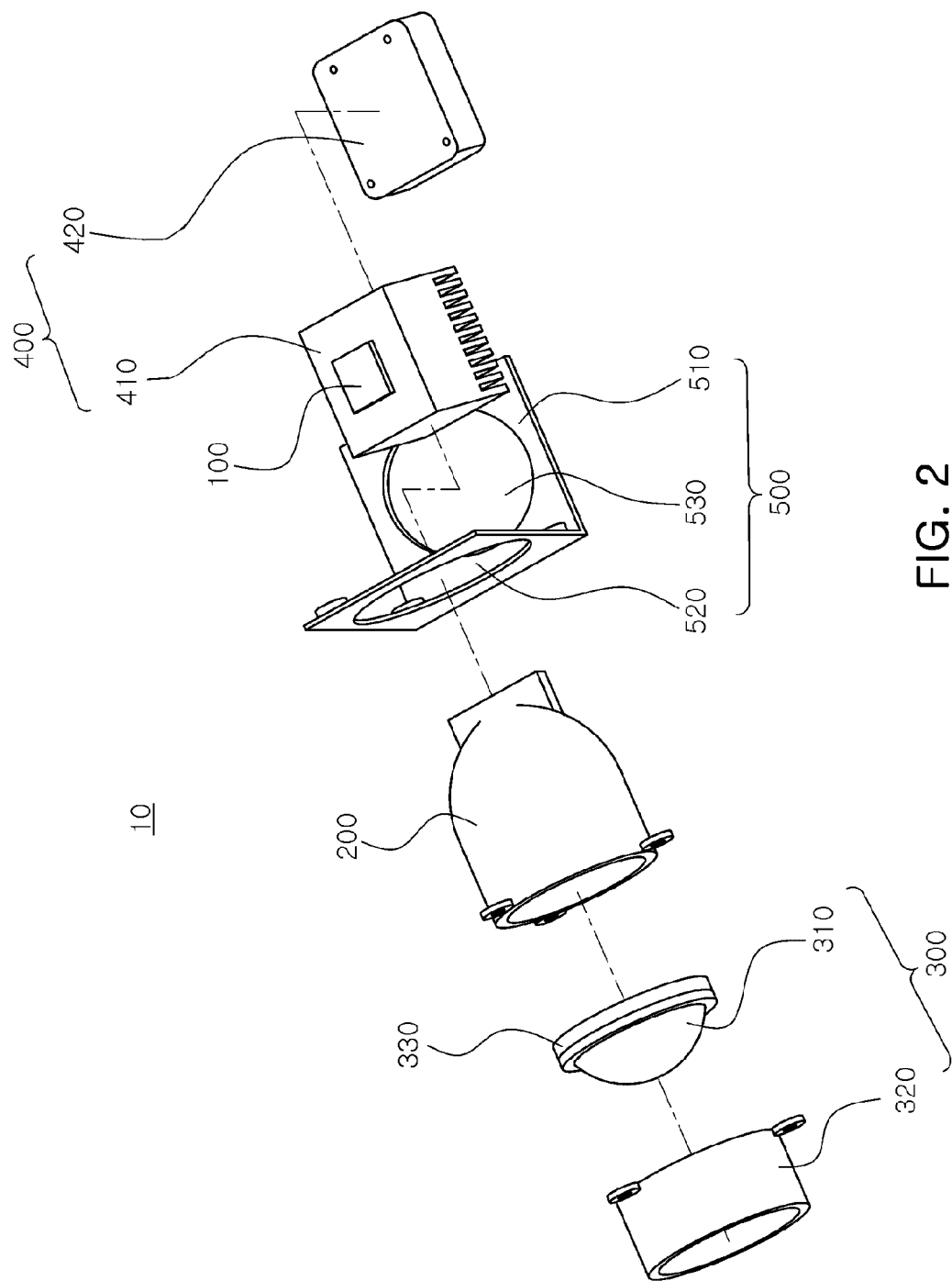
FIG. 2 is an exploded perspective view of the vehicle headlight illustrated in FIG. 1.
Figure 3:
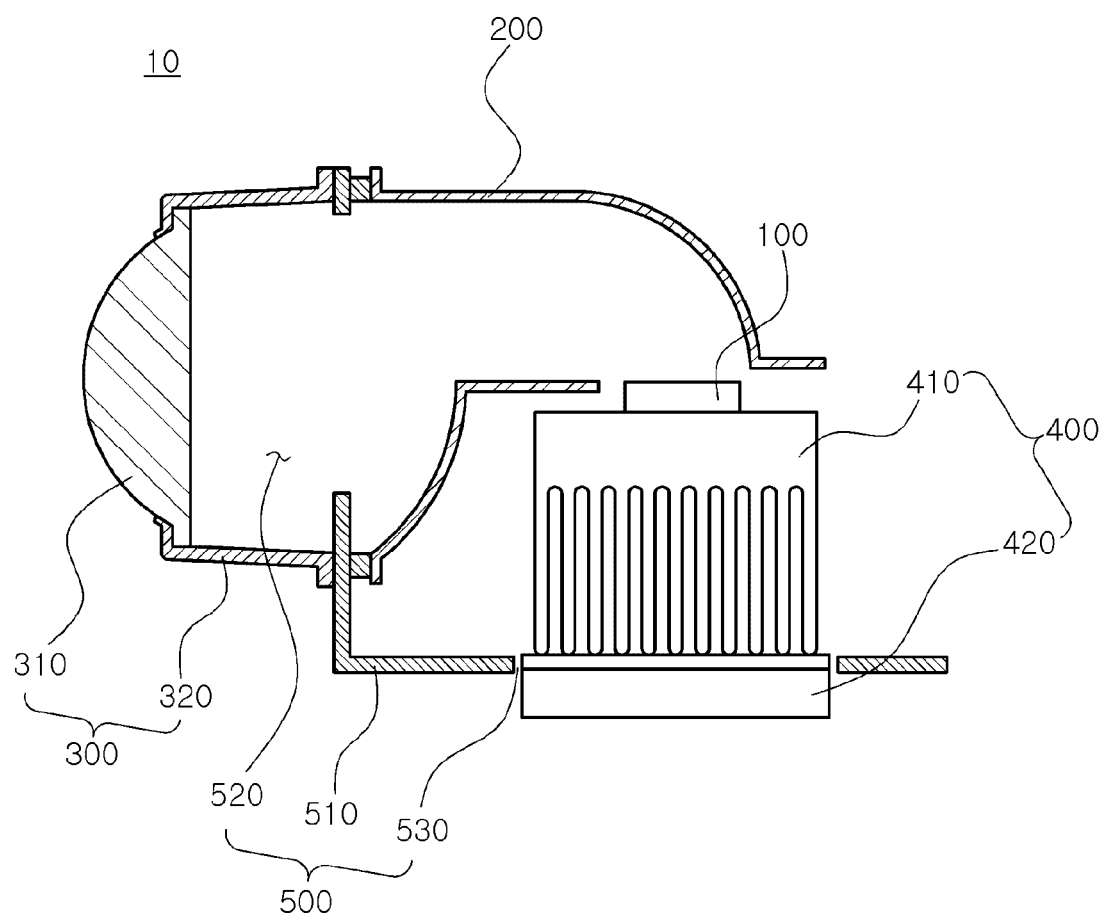
FIG. 3 is a cross-sectional view illustrating the vehicle headlight illustrated in FIG. 2.

FIG. 1 is a schematic view illustrating a configuration of a vehicle headlight according to example embodiments. FIG. 2 is an exploded perspective view of the vehicle headlight illustrated in FIG. 1. FIG. 3 is a cross-sectional view illustrating the vehicle headlight illustrated in FIG. 2.

Referring to FIGS. 1 through 3, according to example embodiments, a headlight 10 for a vehicle may include a light emitting device package 100, a reflective unit 200, and a lens cover unit 300, and may further include a heat dissipation unit 400 transmitting heat generated by the light emitting device package 100 outwardly therefrom.

As illustrated in FIG. 1, a plurality of headlights 10 for a vehicle may be installed, and a reflective mirror 11 may be formed to be adjacent to the headlights 10 for a vehicle to reflect light emitted from the headlights 10 to the front and sides of the vehicle.

The light emitting device package 100 may be mounted on an upper portion of the heat dissipation unit 400 and electrically connected to an external power source to serve as a light source emitting light when power is supplied thereto.

A structure of a light emitting device package 100 of a vehicle headlight according to example embodiments will be described in detail with reference to FIGS. 4, 5A to 5C, 6, and 7A to 7C.

First, a light emitting device package 100 in which a light emitting device chip 110 is installed on a substrate 120 will be described with reference to FIGS. 4, and 5A to 5C.

Figure 4:
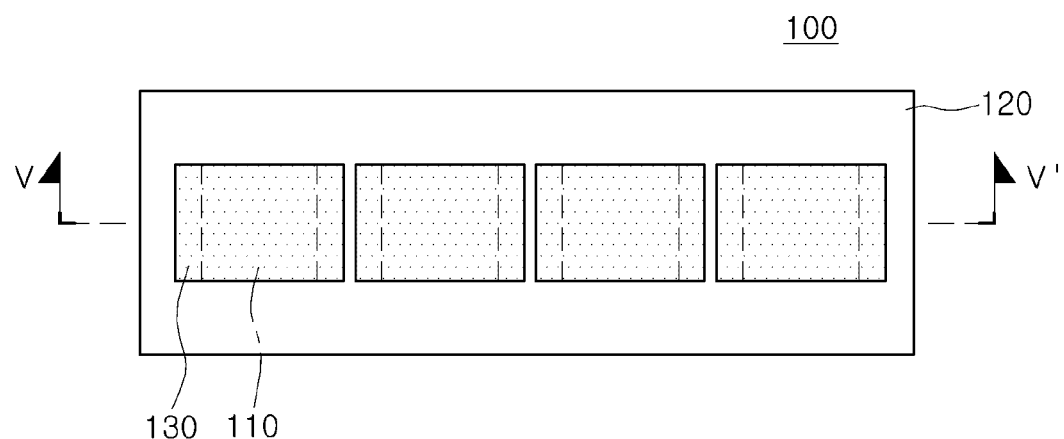
FIG. 4 is a plan view of a light emitting device package in a vehicle headlight according to example embodiments.
Figure 5A:
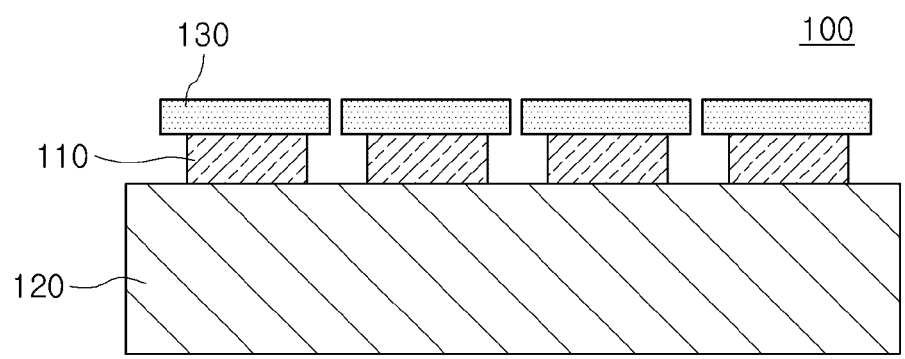
FIGS. 5A to 5C are cross-sectional views of light emitting device packages according to example embodiments, taken along line V-V' of FIG. 4.
Figure 5B:
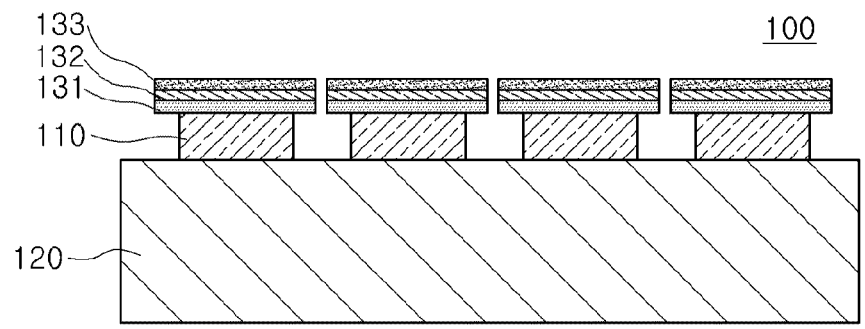
Figure 5C:
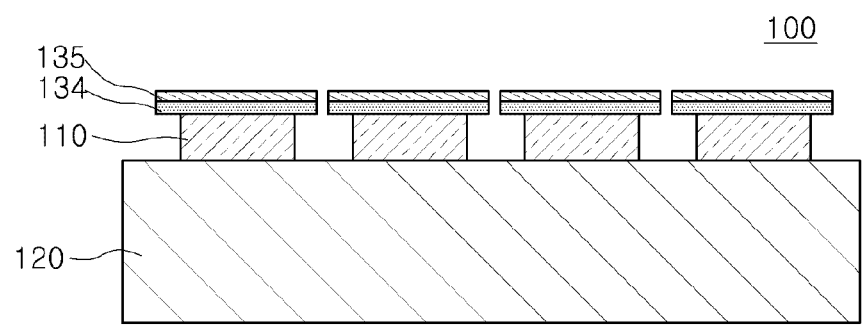
Figure 10:
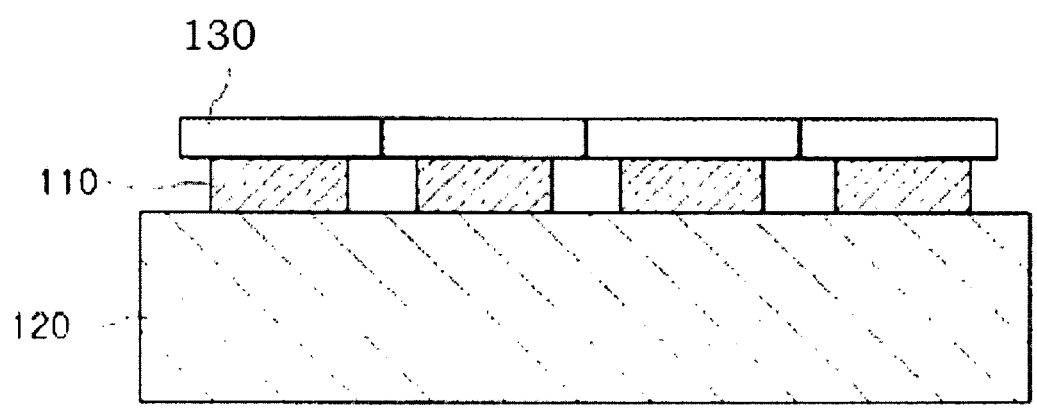
FIG. 10 is a cross-sectional view of a light emitting device package according to example embodiments.

FIG. 4 is a plan view of a light emitting device package in a vehicle headlight according to example embodiments. FIGS. 5A to 5C are cross-sectional views of light emitting device packages according to example embodiments, taken along line V-V' of FIG. 4. FIG. 10 is a cross-sectional view of a light emitting device package according to example embodiments.

Referring FIGS. 4 and 5A, the light emitting device package 100 may include at least one light emitting device chip 110, a substrate 120 on which the light emitting device chip 110 is mounted, and a wavelength conversion unit 130 formed on an upper surface of the light emitting device chip 110. The wavelength conversion unit 130 may contain a wavelength conversion material, and be configured to convert a wavelength of light generated by the light emitting device chip 110 into one or more different wavelengths of light. As shown in FIG. 5A, the light emitting device package may include a plurality of light emitting device chips 110 spaced apart from each other on the substrate 120 and a plurality of wavelength conversion units 130 on the light emitting device chips 110. Lower surfaces of the plurality of wavelength conversion units 130 may extend horizontally from sidewalls of the plurality of light emitting device chips 110, respectively, such that the lower surfaces of the plurality of wavelength conversion units 130 are spaced apart from the substrate 120.

The light emitting device chip 110 may be a type of semiconductor device mounted on the substrate 110 and configured to emit light having a certain wavelength by power applied from the outside. As shown in FIGS. 4 and 5A, a plurality of light emitting device chips 110 are arranged linearly on a bottom surface of the substrate 120.

In this case, the light emitting device chip 110 may be configured as a combination of light emitting device chips emitting blue light (B), red light (R), and green light (G) in an in-line array to emit white light (W). However, example embodiments are not limited thereto and light emitting device chips emitting the same light may also be configured. When the light emitting device chip 110 is a light emitting chip emitting blue light (B), it may implement white light through the wavelength conversion unit 130 (to be described later). Also, the light emitting device chip 110 may emit light in various colors such as red light (R), green light (G), orange light (A), and the like, and of course, light in various colors such as red light (R), green light (G), orange light (A) may be implemented through the wavelength conversion unit 130.

The light emitting device chip 110 may be electrically connected to an electrode terminal formed on the substrate 110 according to a wire bonding scheme through a metal wire, or may be electrically connected to an electrode terminal formed on the substrate 110 according to a flipchip bonding scheme. However, example embodiments are not limited thereto.

The light emitting device package 100 includes the wavelength conversion unit 130 having a portion extending to a region between the plurality of light emitting device chips 110 arranged linearly on upper surfaces of the light emitting device chips 110.

The wavelength conversion unit 130 serves to convert a wavelength of light emitted from the light emitting device chip 110 into a different wavelength, and may be formed as a thin film on a light emitting surface of the light emitting device chip 110. Since the wavelength conversion unit 130 is provided as a thin film, it may have a relatively uniform shape and thickness, a chromaticity deviation of light in a light emitting direction can be reduced (and/or minimized) and, in addition, different chromaticity distributions between devices can also be reduced.

Meanwhile, in order to execute the light conversion function, the wavelength conversion unit 130 may contain a wavelength conversion material such as phosphors or quantum dots. In this case, the wavelength conversion unit 130 may have a plate structure (e.g., a ceramic conversion unit) formed of a wavelength conversion material alone, a film structure in which a wavelength conversion material is dispersed in a silicon resin, or the like. For example, the wavelength conversion unit 130 may be a phosphor film.

Here, the wavelength conversion unit 130 is formed to be longer than a length of one side of the light emitting device chip 110 in a direction in which the light emitting device chips 110 are arranged, in order to cover a region between the light emitting device chips 110. Namely, when the light emitting device chips 110 are arranged linearly in a horizontal direction on a bottom surface of the substrate 120, the wavelength conversion unit 130 is formed to be longer than a length of a horizontal side of the light emitting device chip 110. For example, when the light emitting device chip 110 has a size of about 1×1 mm, the wavelength conversion unit 130 may have a size of about 2×1 mm. Thus, the wavelength conversion unit 130 may have a rectangular shape having a longer side in the direction in which light emitting device chips 110 are arranged. In detail, the longer side of the wavelength conversion unit 130 is longer than a length of one side of the light emitting device chip 110, and a shorter side thereof is similar to a length of one side of the light emitting device chip 110. The wavelength conversion units 130 may have a rectangular shape having a longer side arranged in the direction in which the light emitting device chips 110 are arranged. Alternatively, the wavelength conversion unit 130 may be in contact with a wavelength conversion unit 130 formed on an upper surface of a neighboring light emitting device chip. For example, as shown in FIG. 10, the wavelength conversion units 130 of neighboring light emitting device chips 110 may contact each other.

When the wavelength conversion unit 130 is formed to have a portion extending to a region between the plurality of light emitting devices, it can convert a wavelength of light output to a side direction of the light emitting device chip, reducing a dark portion formed between the light emitting device chips.

Thus, a problem in which irradiated light is seen to be discontinuously separated, rather than being continuous, due to a space between chips because wavelength conversion units are coated on only upper surfaces of light emitting device chips successively disposed in the related art light emitting device package can be solved.

FIG. 5B illustrates a wavelength conversion unit having a multilayer structure (the wavelength conversion unit is illustrated to have a structure including three laminated layers but example embodiments are not limited thereto).

In case that the wavelength conversion unit 130 has a multilayer structure formed by laminating multiple layers, the laminated layers of the wavelength conversion unit 130 may contain the same wavelength conversion material or different wavelength conversion materials.

In case that the laminated multiple layers of the wavelength conversion unit 130 contain phosphors as wavelength conversion materials, the phosphor layers may be sequentially laminated according to lengths of wavelengths such that a phosphor layer emitting light having a shorter wavelength is positioned in a lower side and a phosphor layer emitting light having a longer wavelength is positioned in an upper side.

For example, when the light emitting device chip 110 is a UV light emitting device chip, a first phosphor layer 131 formed on the light emitting device chip 110 may be configured as a phosphor film emitting blue light (B). The phosphor film emitting blue light (B) may include a phosphor excited by ultraviolet rays to emit light having a wavelength ranging from 420 nm to 480 nm.

A second phosphor layer 132 may be laminated on the first phosphor layer 131 and may be configured as a phosphor film emitting green light (G). The phosphor film emitting green light (G) may include a phosphor excited by ultraviolet rays to emit light having a wavelength ranging from 500 nm to 550 nm.

A third phosphor layer 133 may be laminated on the second phosphor layer 132 and may be configured as a phosphor film emitting red light (R). The phosphor film emitting red light (R) may include a phosphor excited by ultraviolet rays to emit light having a wavelength ranging from 580 nm to 700 nm, preferably, light having a wavelength ranging from 600 nm to 650 nm.

Ultraviolet rays emitted from the UV light emitting diode chips through the foregoing configuration excite different types of phosphors contained in the first phosphor layer 131, the second phosphor layer 132, and the third phosphor layer 133. Thus, blue light (B), green light (G), and red light (R) may be emitted from the respective phosphor layers, and light beams in the three colors are combined to form white light (W).

While FIG. 5B illustrates a light emitting device package 100, where the wavelength conversion unit includes three laminated phosphor layers 131 to 133, example embodiments are not limited thereto.

Referring to FIG. 5C, when the light emitting device chip 110 is a blue light emitting device chip, two phosphor layers 134 and 135 may be formed on upper surfaces of the light emitting device chips 110. The two phosphor layers 134 and 135 may convert a portion of blue light emitted from the light emitting device chip into red light and green light, respectively. The red light and green light converted from the phosphor layers 134 and 135 may combined with the unconverted blue light emitted from light emitting device chips 110 to form white light.

Hereinafter, a light emitting device package 102 in which a light emitting device, chip 210 is mounted on a package substrate 220 will be described with reference to FIGS. 6 and 7A to 7C.

Figure 6:
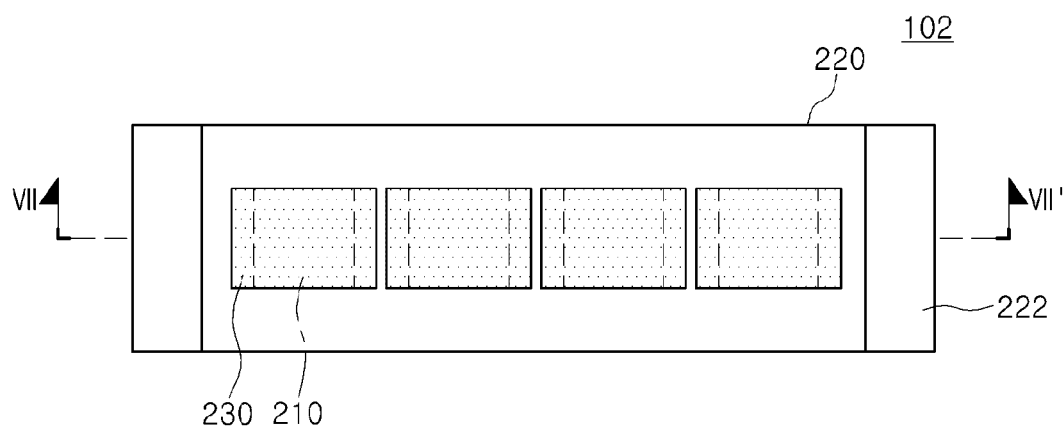
FIG. 6 is a plan view of a light emitting device package in a vehicle headlight according to example embodiments.

FIG. 6 is a plan view of a light emitting device package in a vehicle headlight according to example embodiments.

Figure 7A:
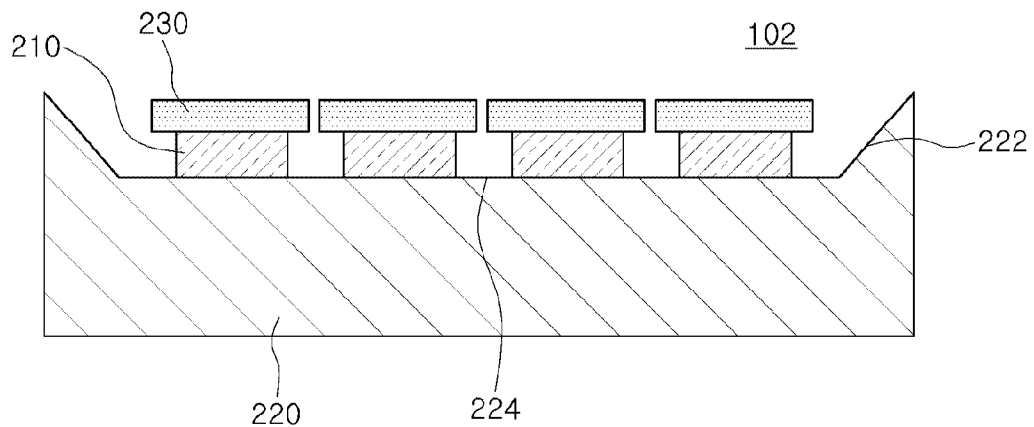
FIGS. 7A to 7C are cross-sectional views of light emitting device packages according to example embodiments, taken along line VII-VII' of FIG. 6.
Figure 7B:
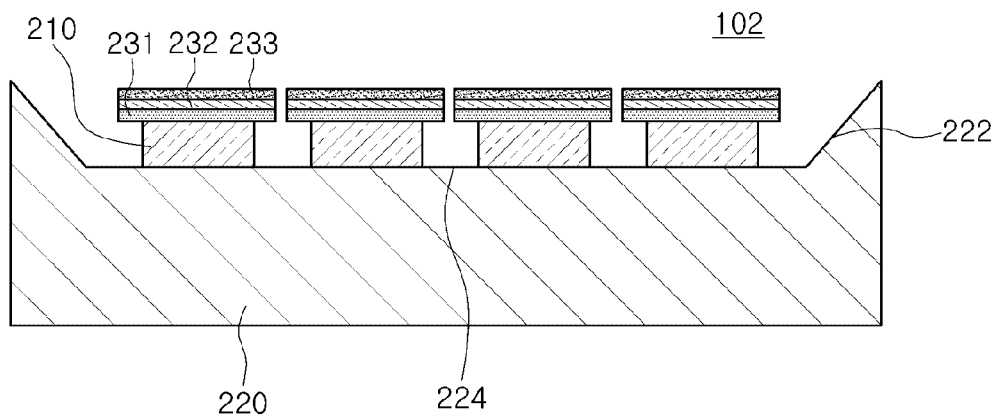
Figure 7C:
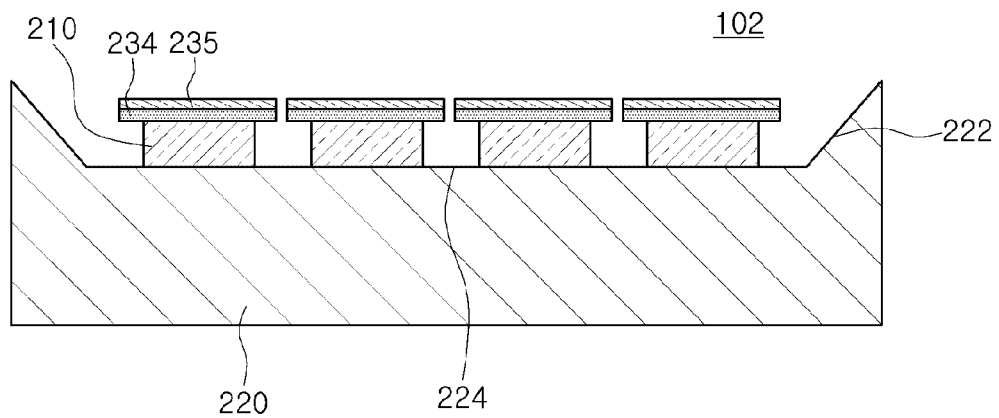

FIGS. 7A to 7C are cross-sectional views of light emitting device packages according to example embodiments, taken along line VII-VII' of FIG. 6, Referring to FIGS. 6 and 7A, the light emitting device package 102 may include at least one light emitting device chip 210, a package substrate 220 allowing the light emitting device chip 210 to be mounted thereon, and a wavelength conversion unit 230 containing a wavelength conversion material and positioned on an upper surface of the light emitting device chip 210.

The package substrate 220 may include a cavity 224 having a reflective surface 222 formed on an inner circumferential surface sloped inwardly toward the light emitting device chip 210. The light emitting device chip 210 may be mounted on an upper surface of the cavity 224 of the package substrate 220.

The cavity 224 may be formed by depressing the upper surface of the package substrate 220 in an area having a desired (and/or alternatively predetermined) size through laser irradiation or etching, or may be formed by molding a resin to have a desired (and/or alternatively predetermined) height along the edges of the upper surface of the package substrate 220 such that the reflective surface 222 is protruded. In order to more efficiently implement the reflective surface 222, a reflective layer having high reflectance may be further provided on the reflective surface 222.

The light emitting device package 102 may include a plurality of wavelength conversion units 230 on the light emitting device chips 210. The plurality of wavelength conversion units 230 may have a portion extending to a region between the plurality of light emitting device chips 210 arranged linearly on upper surfaces of the light emitting device chips 210.

The wavelength conversion units 230 serves to convert a wavelength of light emitted from the light emitting device chip 210 into a different wavelength, and may be formed as a thin film on a light emitting surface of the light emitting device chip 210. Since the wavelength conversion unit 230 is provided as a thin film, it may have a relatively uniform shape and thickness, chromaticity deviation of light in a light emitting direction can be reduced (and/or minimized) and, in addition, different chromaticity distributions between devices can also be reduced.

Meanwhile, in order to execute the light conversion function, the wavelength conversion unit 230 may contain a wavelength conversion material such as phosphors or quantum dots. In this case, the wavelength conversion unit 230 may have a plate structure (e.g., a ceramic conversion unit) formed of a wavelength conversion material alone, a film structure in which a wavelength conversion material is dispersed in a silicon resin, or the like. For example, the wavelength conversion unit 230 may be a phosphor film.

Here, the wavelength conversion unit 230 may be formed to be longer than a length of one side of the light emitting device chip 210 in a direction in which the light emitting device chips 210 are arranged, in order to cover a region between the light emitting device chips 210. Namely, when the light emitting device chips 210 are arranged linearly in a horizontal direction on a bottom surface of the substrate 220, the wavelength conversion unit 230 is formed to be longer than a length of a horizontal side of the light emitting device chip 210. Thus, the wavelength conversion unit 230 may have a rectangular shape having a longer side in the direction in which light emitting device chips 210 are arranged. In detail, the longer side of the wavelength conversion unit 230 is longer than a length of one side of the light emitting device chip 210, and a shorter side thereof is similar to a length of one side of the light emitting device chip 210. The wavelength conversion units 230 may have a rectangular shape having a longer side arranged in the direction in which the light emitting device chips 210 are arranged.

When the wavelength conversion unit 230 is formed to have a portion extending to a region between the plurality of light emitting devices, it can convert a wavelength of light output to a side direction of the light emitting device chip, reducing a dark portion formed between the light emitting device chips.

Thus, a problem in which irradiated light is seen to be discontinuously separated, rather than being continuous, due to a space between chips because wavelength conversion units are coated on only upper surfaces of light emitting device chips successively disposed in the related art light emitting device package can be solved.

In case that the wavelength conversion unit 230 has a multilayer structure, the wavelength conversion unit may include three laminated layers. However, example embodiments are not limited thereto.

Referring to FIG. 7B, according to example embodiments, when the light emitting device chip 210 is a UV light emitting device chip, the wavelength conversion unit 230 may include a first phosphor layer 231, a second phosphor layer 232, and a third phosphor layer 233 may be sequentially laminated according to lengths of wavelengths such that a phosphor layer emitting light having a shorter wavelength is positioned on a lower side and a phosphor layer emitting light having a longer wavelength is positioned on an upper side.

While FIG. 7B illustrates a light emitting device package 102, where the wavelength conversion unit includes three laminated phosphor layers 231 to 233, example embodiments are not limited thereto.

Referring to FIG. 7C, when the light emitting device chip 210 is a blue light emitting device chip, two phosphor layers 234 and 235 may be formed on upper surfaces of the light emitting device chips 210. The two phosphor layers 234 and 235 may convert a portion of blue light emitted from the light emitting device chip 210 into red light and green light, respectively. The red light and green light converted from the phosphor layers 234 and 235 may combine with the unconverted blue light emitted from light emitting device chips 210 to form white light.

Also, although not shown, a lens unit may be formed on an upper surface of the package substrate 220 to cover the cavity 224 to irradiate light generated by the plurality of light emitting device chips 210 in a concentrated manner. Also, the lens unit may be made of a glass material having excellent heat resistance characteristics and may be coupled to the main body through UV curing or heat curing adhesive to limit (and/or prevent) moisture from infiltrating into the light emitting device chip 210, thereby implementing a stable structure in terms of temperature and humidity.

Meanwhile, the heat dissipation unit 400 may include a heat sink 410 and a cooling fan 420. The light emitting device package 100 is provided on an upper portion of the heat dissipation unit 400, and the heat dissipation unit 400 dissipates heat generated by the light emitting device package 100 outwardly therefrom.

In detail, the heat sink 410 allows the light emitting device package 100 to be mounted on an upper surface thereof and dissipate high temperature heat generated by the light emitting device package 100 outwardly therefrom. Here, the heat sink 410 may have a plurality of recesses formed on a lower surface thereof in order to have a large surface area.

The cooling fan 420 may be mounted on a lower side of the heat sink 410 to increase heat dissipation efficiency of the heat sink 410.

The reflective unit 200 is provided on an upper side of the light emitting device package 100 and the heat dissipation unit 400 to guide light output from the light emitting device package 100 such that light is reflected.

As illustrated in FIGS. 2 and 3, the reflective unit 200 has a dome-shaped cross-section to guide light emitted from the light emitting device chip 110 toward a front side of a vehicle. The reflective unit 200 has a shape in which a front side thereof is opened to allow the reflected light to be output to the outside.

The headlight 10 for a vehicle according to example embodiments may further include a housing 500 fixedly supporting the heat dissipation unit 400 and the reflective unit 200.

In detail, the housing 500 includes a housing body 510 that defines a central hole 530 formed to penetrate one surface thereof to allow the heat dissipation unit 400 to be coupled and installed therein, and the housing body 510 further defines a front hole 520 formed to penetrate the other surface integrally connected to the one surface of the housing 500 and bent in a right angle direction to allow the reflective unit 200 to be fixedly positioned in an upper side of the light emitting device package 100.

Thus, the reflective unit 200 is fixed to the housing 500 such that the opened front side thereof corresponds to the front hole 520, to allow light reflected by the reflective unit 200 to pass through the front hole 520 and output to the outside.

The lens cover unit 300 emits light output after being reflected by the reflective unit 200 to the outside and includes a hollow guide 320 and a lens 310.

In detail, the guide 320 is installed on the front hole 520 of the housing 500, and guides light passing through the front hole 520 after being reflected by the reflective unit 200 to a front side.

The guide 320, a plastic injection-molded product formed through injection molding, has a hollow cylindrical structure accommodating the lens 310 therein.

The lens 310 is installed in front of the guide 320 to refract and disperse light toward a front side of the vehicle. Preferably, the lens 310 is made of a transparent material.

As mentioned above, in the light emitting device package of a vehicle headlight according to example embodiments, the wavelength conversion unit is formed to cover up to a region between a plurality of light emitting device chips on an upper surface of the light emitting device chip. Thus, a dark portion formed in the region between the continuously disposed light emitting device chips is reduced by the wavelength conversion unit having a portion extending to the region between the plurality of light emitting device chips, improving light distribution characteristics of the light emitting device package.

Figure 8A:
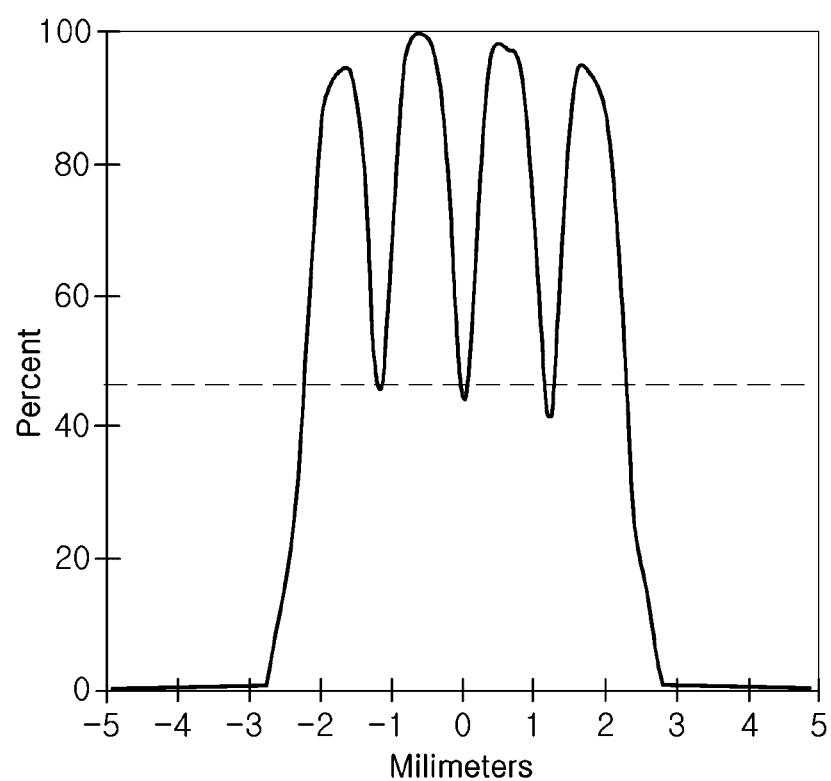
FIG. 8A is a graph showing intensity of light when a wavelength conversion unit is formed to have the same size as that of a light emitting device chip.
Figure 8B:
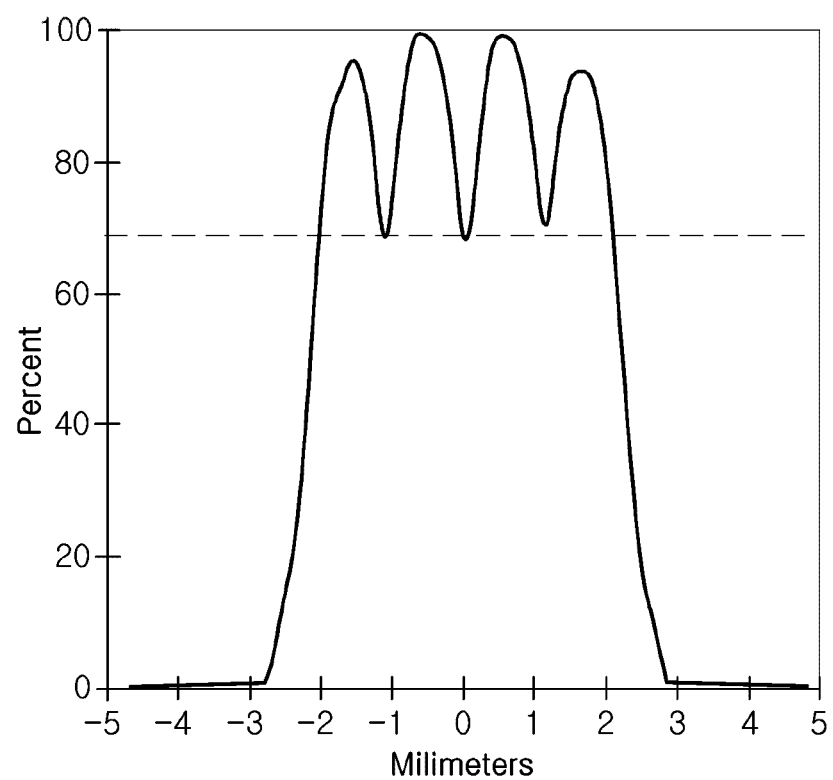
FIG. 8B is a graph showing intensity of light when a wavelength conversion unit is formed on an upper surface of a light emitting device chip according to example embodiments.
Figure 9A:
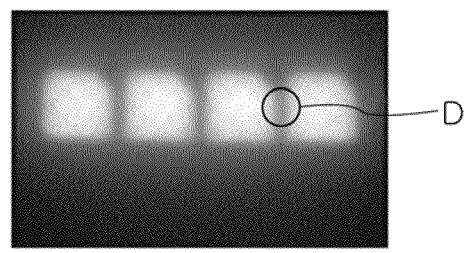
FIG. 9A is a photograph showing light emitted from the light emitting device chip when the wavelength conversion unit is formed to have the same size as that of a light emitting device chip.
Figure 9B:
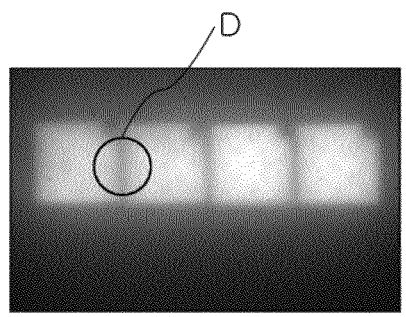
FIG. 9B is a photograph showing light emitted from the light emitting device chip when the wavelength conversion unit is formed on an upper surface of a light emitting device chip according to example embodiments.

FIGS. 8A and 8B are graphs showing an effect according to example embodiments, and FIGS. 9A and 9B are photographs showing an effect according to example embodiments.

FIGS. 8A and 9A are a graph and a photograph showing intensity of light when a wavelength conversion unit is formed to have the same size as that of a light emitting device chip, respectively. FIGS. 8B and 9B are a graph and a photograph showing intensity of light when a wavelength conversion unit is formed on an upper surface of a light emitting device chip according to example embodiments, respectively.

Referring to FIGS. 8A and 8B, when an intensity of light in an upper portion of the light emitting device chip is approximately 100%, an intensity of light in the region between the light emitting device chips is about 50% or less. In comparison, referring to FIG. 8B showing an intensity of light according to example embodiments, when an intensity of light in an upper portion of the light emitting device chip is approximately 100%, an intensity of light in the region between the light emitting device chips is about 70%.

Namely, the intensity of light in the region between the light emitting device chips is increased by about 20% or more. Thus, it can be seen that a formation of a dark portion in the region between the light emitting device chips is reduced according to example embodiments.

Referring to FIGS. 9A and 9B, a dark portion D is apparent in the region between the light emitting device chips in FIG. 9A, while a dark portion D between the light emitting device chips is reduced in FIG. 9B.

In this manner, according to example embodiments, the problem in which irradiated light is seen to be discontinuously separated, rather than being continuous, due to a space between chips because wavelength conversion units are coated on only upper surfaces of light emitting device chips successively disposed in the related art light emitting device package can be solved.

As set forth above, in the case of the light emitting device package and a vehicle headlight according to example embodiments, a light emitting device can be used as a light source and continuous light can be obtained, enhancing light distribution characteristics.

While some example embodiments have been shown and described, it will be apparent to those skilled in the art that modifications and variations can be made without departing from the spirit and scope of the claims.

What is claimed is:

1. A light emitting device package comprising:
a substrate;
a plurality of light emitting device chips arranged linearly and spaced apart from each other on the substrate; and
a plurality of wavelength conversion units on upper surfaces of the plurality of light emitting device chips,
the plurality of wavelength conversion units each having portions that extend over regions between the plurality of light emitting device chips, and
lower surfaces of the plurality of wavelength conversion units extending horizontally from sidewalls of the plurality of light emitting device chips, respectively, such that the lower surfaces of the plurality of wavelength conversion units are spaced apart from the substrate.

2. The light emitting device package of claim 1, wherein the plurality of wavelength conversion units contact each other.

3. The light emitting device package of claim 1, wherein the plurality of wavelength conversion units include phosphor films.

4. The light emitting device package of claim 1, wherein the plurality of wavelength conversion units include one or more phosphor layers.

5. The light emitting device package of claim 1, wherein each of the plurality of wavelength conversion units has a rectangular shape, and
a longer side of the rectangular shape extends in a direction in which the light emitting device chips are arranged.

6. The light emitting device package of claim 5, wherein the longer side of each of the plurality of wavelength conversion units is longer than one side of each of the light emitting device chips, and
a shorter side of each of the plurality of wavelength conversion units is the same as a length of a different side of each of the light emitting device chips.

7. The light emitting device package of claim 1, wherein an upper surface of the substrate, sidewalls of an adjacent two of the plurality of light emitting device chips, and parts of lower surfaces of an adjacent two of the plurality of wavelength conversion units define a cavity, and
the upper surface of the substrate includes a reflective surface along an inner circumferential surface that is sloped inwardly toward the plurality of light emitting device chips.

8. A vehicle headlight, comprising:
the light emitting device package of claim 1;

a heat dissipation unit,
the light emitting device package on the heat dissipation unit,
the heat dissipation unit being configured to transmit heat generated by the light emitting device package outwardly away from the light emitting device package;
a reflective unit over an upper side of the light emitting device package and the heat dissipation unit,
the reflective unit being configured guide and reflect light output from the light emitting device package; and
a lens cover unit configured to emit light reflected through the reflective unit to the outside.

9. The vehicle headlight of claim 8, wherein
the heat dissipation unit includes a heat sink on a cooling fan,
the light emitting device package is on the heat sink,
the heat sink is configured to transmit heat generated by the light emitting device package outwardly and away from the light emitting device package, and
the cooling fan is configured to increase a heat emission efficiency of the heat sink.

10. The vehicle headlight of claim 8, wherein the plurality of wavelength conversion units contact each other.

11. The vehicle headlight of claim 8, wherein
each of the plurality of wavelength conversion units has a rectangular shape, and
a longer side of the rectangular shape extends in a direction in which the light emitting device chips are arranged.

12. The vehicle headlight of claim 11, wherein
the longer side of each of the plurality of wavelength conversion units is longer than one side of each of the light emitting device chips, and
a shorter side of each of the wavelength conversion units is the same as a length of a different side of each of the light emitting device chips.

13. The vehicle headlight of claim 8, wherein
an upper surface of the substrate, sidewalls of an adjacent two of the plurality of light emitting device chips, and parts of lower surfaces of an adjacent two of the plurality of wavelength conversion units define a cavity, and
the upper surface of the substrate includes a reflective surface along an inner circumferential surface that is sloped inwardly toward the plurality of light emitting device chips.

14. The light emitting device package of claim 1, wherein the plurality of wavelength conversion units directly contact the plurality of light emitting device chips.

15. A light emitting device package comprising:
a substrate;
a plurality of light emitting device chips spaced apart from each other in a first direction on the substrate; and
a plurality of wavelength conversion units on the plurality of light emitting device chips,
the plurality of wavelength conversion units each extending parallel to an upper surface of the substrate,
at least one of the plurality of wavelength conversion units each being wider in the first direction than a width in the first direction of a corresponding one of the plurality of light emitting device chips, and
lower surfaces of the plurality of wavelength conversion units extending horizontally from sidewalls of the plurality of light emitting device chips, respectively, such that the lower surfaces of the plurality of wavelength conversion units are spaced apart from the substrate.

16. The light emitting device package of claim 15, wherein
each one of the plurality of wavelength conversion units includes a plurality of phosphor layers stacked on each other,
one of the plurality of phosphor layers is configured to emit a shorter wavelength of light than a different one of the plurality of phosphor layers, and
the different one of the plurality of phosphor layers is on the one of the plurality of phosphor layers.

17. The light emitting device package of claim 15, wherein
the plurality of wavelength conversion units each include,
a first phosphor film configured to convert light from the plurality of light emitting device chips into a first wavelength of light,
a second phosphor film on the first phosphor film, the second phosphor film being configured to convert light from the plurality of light emitting device chips into a second wavelength of light,
a third phosphor film on the second phosphor film, the third phosphor film being configured to convert light from the plurality of light emitting device chips into a third wavelength of light;
the third wavelength of light is longer than the second wavelength of light,
the second wavelength of light is longer than the first wavelength of light, and
the first to third wavelengths of light combine to form white light.

18. The light emitting device package of claim 15, wherein
the upper surface of the substrate includes a middle portion and a sloped portion,
the plurality of light emitting device chips are on the middle portion of the substrate, and
the sloped portion is an inner circumferential surface sloped inwardly toward the plurality of light emitting device chips.

19. A vehicle headlight, comprising:
the light emitting device package of claim 15;
a heat dissipation unit,
the light emitting device package on the heat dissipation unit,
the heat dissipation unit configured to transmit heat generated by the light emitting device package outwardly away from the light emitting device package;
a reflective unit over an upper side of the light emitting device package and the heat dissipation unit,
the reflective unit being configured guide and reflect light output from the light emitting device package; and
a lens cover unit configured to emit light reflected through the reflective unit to the outside.

20. The light emitting device package of claim 15, wherein the plurality of wavelength conversion units directly contact the plurality of light emitting device chips.

* * * * *